United States Patent
Fox et al.

(10) Patent No.: US 9,362,974 B2
(45) Date of Patent: Jun. 7, 2016

(54) METHODS AND SYSTEMS FOR HIGH BANDWIDTH CHIP-TO-CHIP COMMUNICATIONS INTERFACE

(71) Applicant: KANDOU LABS S.A., Lausanne (CH)

(72) Inventors: John Fox, Kislingbury (GB); Brian Holden, Monte Sereno, CA (US); Peter Hunt, Northampton (GB); John D. Keay, Bedford (GB); Amin Shokrollahi, Preverenges (CH); Andrew Kevin John Stewart, Astcote (GB); Giuseppe Surace, Northampton (GB); Roger Ulrich, Bern (CH); Richard Simpson, Bedford (GB)

(73) Assignee: Kandou Labs, S.A. (CH)

( * ) Notice: Subject to any disclaimer, the term of this patent is extended or adjusted under 35 U.S.C. 154(b) by 0 days.

(21) Appl. No.: 14/823,870

(22) Filed: Aug. 11, 2015

(65) Prior Publication Data
US 2015/0349835 A1    Dec. 3, 2015

Related U.S. Application Data

(63) Continuation of application No. 14/178,051, filed on Feb. 11, 2014, now Pat. No. 9,106,220.

(60) Provisional application No. 61/763,403, filed on Feb. 11, 2013.

(51) Int. Cl.
*H04B 1/40*    (2015.01)
*H04L 29/08*    (2006.01)
(Continued)

(52) U.S. Cl.
CPC .......... *H04B 1/40* (2013.01); *H03K 19/017509* (2013.01); *H03K 19/018521* (2013.01); *H04L 67/12* (2013.01); *H01L 23/147* (2013.01);
(Continued)

(58) Field of Classification Search
CPC .............. H03K 19/017509; H03K 19/018521; H04L 5/0091; H04B 3/04; H04B 1/40; G06F 13/38
See application file for complete search history.

(56) References Cited

U.S. PATENT DOCUMENTS 3,196,351 A    7/1965    Slepian
3,636,463 A    1/1972    Ongkiehong
(Continued)

FOREIGN PATENT DOCUMENTS

CN    101478286    7/2009
EP    2039221 B1    3/2009
(Continued)

OTHER PUBLICATIONS

International Search Report and Written Opinion of the International Searching Authority, mailed Nov. 5, 2012, in International Patent Application S.N. PCT/EP2012/052767, 7 pages.
(Continued)

*Primary Examiner* — Curtis Odom
(74) *Attorney, Agent, or Firm* — Invention Mine LLC

(57) ABSTRACT

Systems and methods are described for transmitting data over physical channels to provide a high bandwidth, low latency interface between integrated circuit chips with low power utilization. Communication is performed using group signaling over multiple wires using a vector signaling code, where each wire carries a low-swing signal that may take on more than two signal values.

20 Claims, 11 Drawing Sheets

(51) Int. Cl.
   *H03K 19/0175* (2006.01)
   *H03K 19/0185* (2006.01)
   *H01L 23/14* (2006.01)
   *H01L 23/538* (2006.01)

(52) U.S. Cl.
   CPC ......... *H01L23/5384* (2013.01); *H01L 2224/16* (2013.01); *H01L 2924/15174* (2013.01); *H01L 2924/15192* (2013.01)

(56) References Cited

U.S. PATENT DOCUMENTS

| | | |
|---|---|---|
| 3,939,468 A | 2/1976 | Mastin |
| 4,163,258 A | 7/1979 | Ebihara et al. |
| 4,181,967 A | 1/1980 | Nash et al. |
| 4,206,316 A | 6/1980 | Burnsweig et al. |
| 4,276,543 A | 6/1981 | Miller |
| 4,486,739 A | 12/1984 | Franaszek et al. |
| 4,499,550 A | 2/1985 | Ray et al. |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,053,974 A | 10/1991 | Penz |
| 5,166,956 A | 11/1992 | Baltus et al. |
| 5,168,509 A | 12/1992 | Nakamura et al. |
| 5,283,761 A | 2/1994 | Gillingham |
| 5,287,305 A | 2/1994 | Yoshida |
| 5,412,689 A | 5/1995 | Chan et al. |
| 5,459,465 A | 10/1995 | Kagey |
| 5,511,119 A | 4/1996 | Lechleider |
| 5,553,097 A | 9/1996 | Dagher |
| 5,599,550 A | 2/1997 | Kohlruss et al. |
| 5,659,353 A | 8/1997 | Kostreski et al. |
| 5,825,808 A | 10/1998 | Hershey et al. |
| 5,875,202 A | 2/1999 | Venters |
| 5,945,935 A | 8/1999 | Kusumoto |
| 5,995,016 A | 11/1999 | Perino |
| 6,005,895 A | 12/1999 | Perino et al. |
| 6,084,883 A | 7/2000 | Norrell et al. |
| 6,172,634 B1 | 1/2001 | Leonowich et al. |
| 6,175,230 B1 | 1/2001 | Hamblin et al. |
| 6,232,908 B1 | 5/2001 | Nakaigawa |
| 6,278,740 B1 | 8/2001 | Nordyke |
| 6,346,907 B1 | 2/2002 | Dacy |
| 6,359,931 B1 | 3/2002 | Perino et al. |
| 6,404,820 B1 | 6/2002 | Postol |
| 6,417,737 B1 | 7/2002 | Moloudi et al. |
| 6,452,420 B1 | 9/2002 | Wong |
| 6,483,828 B1 | 11/2002 | Balachandran |
| 6,504,875 B2 | 1/2003 | Perino et al. |
| 6,509,773 B2 | 1/2003 | Buchwald |
| 6,556,628 B1 | 4/2003 | Poulton et al. |
| 6,563,382 B1 | 5/2003 | Yang et al. |
| 6,621,427 B2 | 9/2003 | Greenstreet |
| 6,650,638 B1 | 11/2003 | Walker et al. |
| 6,661,355 B2 | 12/2003 | Cornelius et al. |
| 6,766,342 B2 | 7/2004 | Kechriotis |
| 6,839,429 B1 | 1/2005 | Gaikwald et al. |
| 6,954,492 B1 | 10/2005 | Williams |
| 6,990,138 B2 | 1/2006 | Bejjani |
| 6,999,516 B1 | 2/2006 | Rajan |
| 7,023,817 B2 | 4/2006 | Kuffner |
| 7,053,802 B2 | 5/2006 | Cornelius |
| 7,085,153 B2 | 8/2006 | Ferrant et al. |
| 7,142,612 B2 | 11/2006 | Horowitz et al. |
| 7,142,865 B2 | 11/2006 | Tsai |
| 7,167,019 B2 | 1/2007 | Broyde et al. |
| 7,180,949 B2 | 2/2007 | Kleveland et al. |
| 7,184,483 B2 | 2/2007 | Rajan |
| 7,356,213 B1 | 4/2008 | Cunningham et al. |
| 7,358,869 B1 | 4/2008 | Chiarulli et al. |
| 7,362,130 B2 | 4/2008 | Broyde et al. |
| 7,389,333 B2 | 6/2008 | Moore et al. |
| 7,633,850 B2 | 12/2009 | Ahn |
| 7,656,321 B2 | 2/2010 | Wang |
| 7,706,524 B2 | 4/2010 | Zerbe |
| 7,746,764 B2 | 6/2010 | Rawlins et al. |
| 7,787,572 B2 | 8/2010 | Scharf et al. |
| 7,882,413 B2 | 2/2011 | Chen et al. |
| 7,933,770 B2 | 4/2011 | Kruger et al. |
| 8,064,535 B2 | 11/2011 | Wiley |
| 8,091,006 B2 | 1/2012 | Prasad et al. |
| 8,106,806 B2 | 1/2012 | Toyomura |
| 8,159,375 B2 | 4/2012 | Abbasafar |
| 8,159,376 B2 | 4/2012 | Abbasfar |
| 8,199,849 B2 | 6/2012 | Oh |
| 8,279,094 B2 | 10/2012 | Abbasfar |
| 8,295,250 B2 | 10/2012 | Gorokhov |
| 8,310,389 B1 | 11/2012 | Chui |
| 8,429,495 B2 | 4/2013 | Przybylski |
| 8,442,099 B1 | 5/2013 | Sederat |
| 8,442,210 B2 | 5/2013 | Zerbe |
| 8,443,223 B2 | 5/2013 | Abbasfar |
| 8,462,891 B2 | 6/2013 | Kizer et al. |
| 8,520,493 B2 | 8/2013 | Goulahsen |
| 8,547,272 B2 | 10/2013 | Nestler et al. |
| 8,578,246 B2 | 11/2013 | Mittelholzer |
| 8,588,280 B2 | 11/2013 | Oh et al. |
| 8,593,305 B1 | 11/2013 | Tajalli et al. |
| 8,649,445 B2 | 2/2014 | Cronie |
| 8,649,460 B2 | 2/2014 | Ware et al. |
| 8,718,184 B1 | 5/2014 | Cronie |
| 8,782,578 B2 | 7/2014 | Tell |
| 8,989,317 B1 | 3/2015 | Holden |
| 9,077,386 B1 | 7/2015 | Holden |
| 2001/0006538 A1 | 7/2001 | Simon et al. |
| 2001/0055344 A1 | 12/2001 | Lee et al. |
| 2002/0034191 A1 | 3/2002 | Shattil |
| 2002/0044316 A1 | 4/2002 | Myers |
| 2002/0057592 A1 | 5/2002 | Robb |
| 2002/0163881 A1 | 11/2002 | Dhong |
| 2002/0174373 A1 | 11/2002 | Chang |
| 2003/0048210 A1 | 3/2003 | Kiehl |
| 2003/0071745 A1 | 4/2003 | Greenstreet |
| 2003/0105908 A1 | 6/2003 | Perino et al. |
| 2003/0146783 A1 | 8/2003 | Brandy et al. |
| 2003/0227841 A1 | 12/2003 | Tateishi et al. |
| 2004/0003336 A1 | 1/2004 | Cypher |
| 2004/0003337 A1 | 1/2004 | Cypher |
| 2004/0057525 A1 | 3/2004 | Rajan et al. |
| 2004/0086059 A1 | 5/2004 | Eroz et al. |
| 2004/0156432 A1 | 8/2004 | Hidaka |
| 2005/0057379 A1 | 3/2005 | Jansson |
| 2005/0135182 A1 | 6/2005 | Perino et al. |
| 2005/0149833 A1 | 7/2005 | Worley |
| 2005/0152385 A1 | 7/2005 | Cioffi |
| 2005/0174841 A1 | 8/2005 | Ho |
| 2005/0286643 A1 | 12/2005 | Ozawa et al. |
| 2006/0018344 A1 | 1/2006 | Pamarti |
| 2006/0115027 A1 | 6/2006 | Srebranig |
| 2006/0159005 A1 | 7/2006 | Rawlins et al. |
| 2006/0269005 A1 | 11/2006 | Laroia |
| 2007/0188367 A1 | 8/2007 | Yamada |
| 2007/0260965 A1 | 11/2007 | Schmidt et al. |
| 2007/0263711 A1 | 11/2007 | Kramer et al. |
| 2007/0283210 A1 | 12/2007 | Prasad et al. |
| 2008/0104374 A1 | 5/2008 | Mohamed |
| 2008/0159448 A1 | 7/2008 | Anim-Appiah et al. |
| 2008/0169846 A1 | 7/2008 | Lan et al. |
| 2008/0273623 A1 | 11/2008 | Chung et al. |
| 2008/0284524 A1 | 11/2008 | Kushiyama |
| 2009/0059782 A1 | 3/2009 | Cole |
| 2009/0092196 A1 | 4/2009 | Okunev |
| 2009/0132758 A1 | 5/2009 | Jiang |
| 2009/0154500 A1 | 6/2009 | Diab et al. |
| 2009/0163612 A1 | 6/2009 | Brady et al. |
| 2009/0185636 A1 | 7/2009 | Palotai et al. |
| 2009/0193159 A1 | 7/2009 | Li |
| 2009/0212861 A1 | 8/2009 | Lim et al. |
| 2009/0228767 A1 | 9/2009 | Oh et al. |
| 2009/0257542 A1 | 10/2009 | Evans et al. |
| 2010/0020898 A1 | 1/2010 | Stojanovic |
| 2010/0046644 A1 | 2/2010 | Mazet |

(56) References Cited

U.S. PATENT DOCUMENTS

| | | |
|---|---|---|
| 2010/0104047 A1 | 4/2010 | Chen et al. |
| 2010/0177816 A1 | 7/2010 | Malipatil |
| 2010/0180143 A1 | 7/2010 | Ware et al. |
| 2010/0205506 A1 | 8/2010 | Hara |
| 2010/0296550 A1 | 11/2010 | Abou Rjeily |
| 2010/0309964 A1* | 12/2010 | Oh ................. G06F 13/4243 375/219 |
| 2011/0014865 A1 | 1/2011 | Seo |
| 2011/0051854 A1 | 3/2011 | Kizer et al. |
| 2011/0084737 A1 | 4/2011 | Oh et al. |
| 2011/0127990 A1 | 6/2011 | Wilson et al. |
| 2011/0235501 A1 | 9/2011 | Goulahsen |
| 2011/0268225 A1 | 11/2011 | Cronie et al. |
| 2011/0299555 A1 | 12/2011 | Cronie et al. |
| 2011/0302478 A1 | 12/2011 | Cronie et al. |
| 2011/0317559 A1 | 12/2011 | Kern et al. |
| 2012/0063291 A1 | 3/2012 | Hsueh |
| 2012/0161945 A1 | 6/2012 | Single |
| 2012/0213299 A1 | 8/2012 | Cronie et al. |
| 2013/0010892 A1 | 1/2013 | Cronie et al. |
| 2013/0051162 A1 | 2/2013 | Amirkhany et al. |
| 2013/0163126 A1 | 6/2013 | Dong |
| 2014/0198837 A1 | 7/2014 | Fox |
| 2014/0254730 A1 | 9/2014 | Kim et al. |
| 2015/0010044 A1 | 1/2015 | Zhang |
| 2015/0078479 A1 | 3/2015 | Whitby-Stevens |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

International Search Report and Written Opinion of the International Searching Authority, mailed Jul. 14, 2011 in International Patent Application S.N. PCT/EP2011/002170, 10 pages.
Healey, A., et al., "A Comparison of 25 Gbps NRZ & PAM-4 Modulation used in Legacy & Premium Backplane Channels", DesignCon 2012, 16 pages.
International Search Report for PCT/US2014/053563, dated Nov. 11, 2014, 2 pages.
Clayton, P., "Introduction to Electromagnetic Compatibility", Wiley-Interscience, 2006.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Poulton, et al., "Multiwire Differential Signaling", UNC-CH Department of Computer Science Version 1.1, Aug. 6, 2003.
Skliar et al., A Method for the Analysis of Signals: the Square-Wave Method, Mar. 2008, Revista de Matematica: Teoria y Aplicationes, pp. 09-129.
International Search Report and Written Opinion from PCT/US2014/034220 mailed Aug. 21, 2014.
International Search Report and Written Opinion for PCT/US14/052986 mailed Nov. 24, 2014.
Burr, "Spherical Codes for M-ARY Code Shift Keying", University of York, Apr. 2, 1989, pp. 67-72, United Kingdom.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallani, L., et al., "Transmission Time Analysis for the Parallel Asynchronous Communication Scheme", IEEE Tranactions on Computers, vol. 52, No. 5, May 2003, pp. 558-571.
International Search Report and Written Opinion for PCT/EP2012/052767 mailed May 11, 2012.
International Search Report and Written Opinion for PCT/EP2011/059279 mailed Sep. 22, 2011.
International Search Report and Written Opinion for PCT/EP2011/074219 mailed Jul. 4, 2012.
Notification of Transmittal of the International Search Report and the Written Opinion of the International Searching Authority, or the Declaration for PCT/EP2013/002681, dated Feb. 25, 2014, 15 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Abbasfar, A., "Generalized Differential Vector Signaling", IEEE International Conference on Communications, ICC '09, (Jun. 14, 2009), pp. 1-5.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Cheng, W., "Memory Bus Encoding for Low Power: A Tutorial", Quality Electronic Design, IEEE, International Symposium on Mar. 26-28, 2001, pp. 199-204, Piscataway, NJ.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.
Notification of Transmittal of International Search Report and the Written Opinion of the International Searching Authority, for PCT/US2015/018363, mailed Jun. 18, 2015, 13 pages.
Counts, L., et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http.//www.retrothing.com/2006/08/classic_analog_.html.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, dated Mar. 3, 2015, for PCT/US2014/066893, 9 pages.
International Preliminary Report on Patentability for PCT/US2014/015840, dated Aug. 11, 2015, 7 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The streTched"-Golay and other codes for high-SNR finite-delay quantization of the Gaussian source at 1/2 Bit per sample, IEEE Transactions on Communications, vol. 38, No. 12 Dec. 1, 1990, pp. 2089-2093, XP000203339, ISSN: 0090-6678, DOI: 10.1109/26.64647.

(56) References Cited

OTHER PUBLICATIONS

Oh, et al., Pseudo-Differential Vector Signaling for Noise Reduction in Single-Ended Signaling, DesignCon 2009.
Notification of Transmittal of the International Search Report and the Written Opinion of the International Searching Authority, or the Declaration, for PCT/US2015/043463, dated Oct. 16, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/037466, dated Nov. 19, 2015.

* cited by examiner

METHODS AND SYSTEMS FOR HIGH BANDWIDTH CHIP-TO-CHIP COMMUNICATIONS INTERFACE

CROSS REFERENCES

This application is a Continuation of and claims priority under 35 USC §120 to U.S. application Ser. No. 14/178,051, filed Feb. 11, 2014, naming John Fox, entitled "Methods and Systems for High Bandwidth Chip-to-Chip Communications Interface," which is a non-provisional application claiming priority under 35 USC §119 to U.S. provisional application No. 61/763,403 filed on Feb. 11, 2013, the contents of which are hereby incorporated herein by reference in their entirety for all purposes.

The following references are herein incorporated by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. Provisional Patent Application No. 61/753,870, filed Jan. 17, 2013, as well as U.S. Non Provisional 14/158,452 filed Jan. 17, 2014, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I").

BACKGROUND

In communication systems, information may be transmitted from one physical location to another. Furthermore, it is typically desirable that the transport of this information is reliable, is fast and consumes a minimal amount of resources. One of the most common information transfer mediums is the serial communications link, which may be based on a single wire circuit relative to ground or other common reference, multiple such circuits relative to ground or other common reference, or multiple circuits used in relation to each other.

An example of the latter uses differential signaling (DS). Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver, over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Fox I.

BRIEF SUMMARY

In accordance with at least one embodiment, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a ternary vector signaling code wherein each wire signal has one of three values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

DETAILED DESCRIPTION

Despite the increasing technological ability to integrate entire systems into a single integrated circuit, multiple chip systems and subsystems retain significant advantages. Partitioning a large system into chip-scale elements may allow each chip to be fabricated using an optimized process providing, as examples, higher voltage tolerance, lower leakage, higher transistor gain, etc. Smaller chips may also exhibit higher yields, and therefore may enable lower systems costs. A small set of such optimized chips may be combined in multiple combinations producing a wide variety of integrated systems, individual chips may be revised independently, and customer-specific features may be added at the system integration level.

One significant difficulty in such partitioning is in finding demarcation points between subsystems that not only represent desirable divisions between implementation methods, but also correspond to well-defined and implementable interfaces. Historically, demarcations requiring high-bandwidth and/or low latency interconnection have been precluded, due to the complexity of implementing a physical interface requiring hundreds or thousands of discrete pins and wires, with the resulting high power consumption of the necessary I/O drivers and receivers.

A number of solutions have become available to mitigate these constraints. Flip-chip or through-chip interconnections using micro-ball connections allow hundreds or thousands of connections per chip. Chip carriers such as a silicon interposer may provide wire paths of hundreds of signals per millimeter, with tightly controlled signal path routing and stable transmission line characteristics for inter-chip communications distances on the order of one millimeter. Thus, the physical infrastructure that would support high-bandwidth chip-to-chip connectivity is available, if the power, complexity, and other circuit implementation issues for such interfaces could be resolved.

For purposes of description and without limitation, example embodiments of at least some aspects of the invention herein described assume a systems environment having:
- at least one communications interface connecting at least two integrated circuit ("IC") chips representing at least a transmitter and a receiver, with the communications interface supported by an interconnection of 100 wires or less in some examples,
- a silicon interposer device interconnecting at least the two IC chips, using micro-bump or micro-ball-array connections with a wiring density of around 100 lines/mm and a controlled-impedance, controlled-skew inter-device signal path of one millimeter or so,
- an aggregate bandwidth of at least around 500 gigabits per second across the communications interface, and
- a combined power consumption for the active transmitter and receiver of the communications interface of less than about 250 milliwatts in a medium range process technology node, such as a general-purpose 40 nm integrated circuit process.

Figure 10:
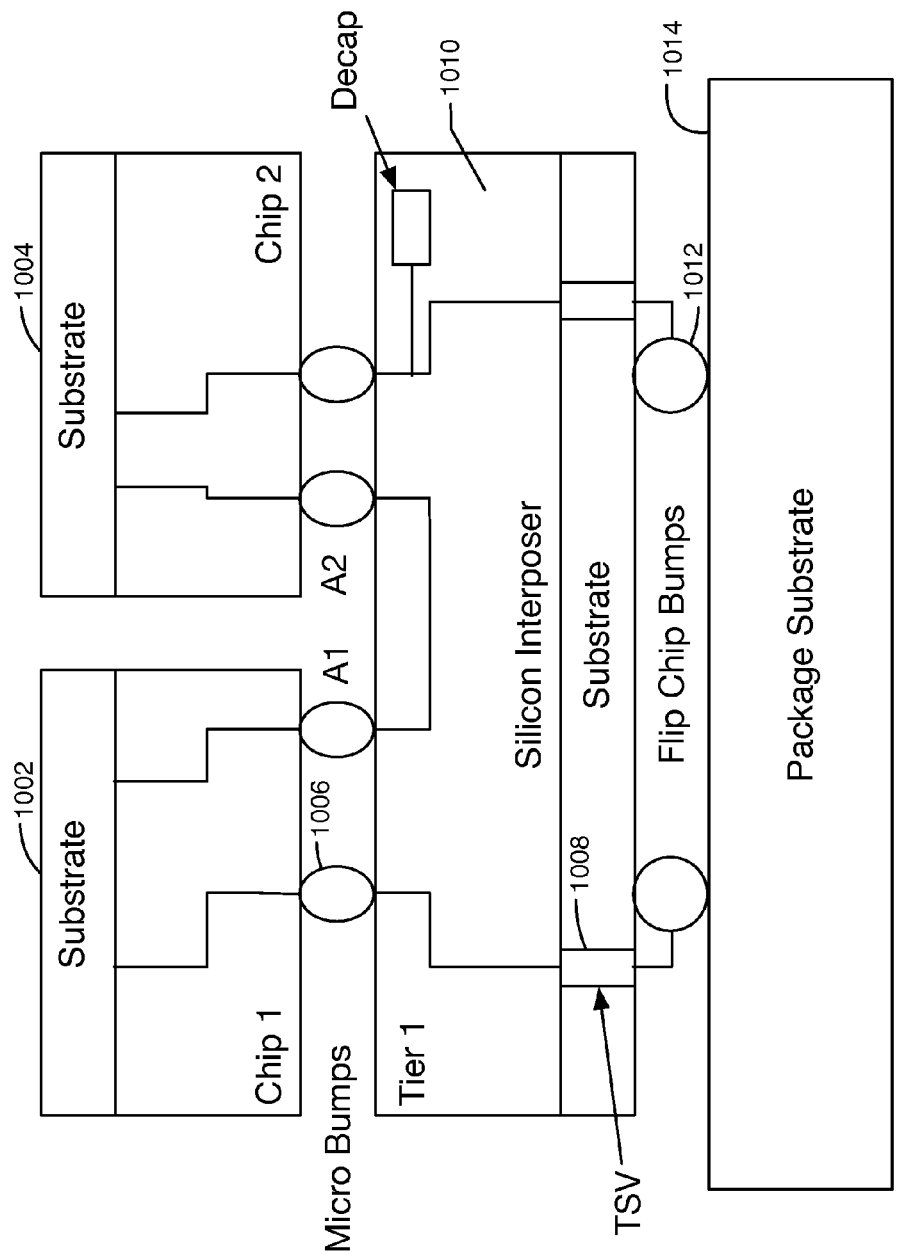
FIG. 10 is an illustration of integrated circuit devices interconnected by a silicon interposer, in accordance with at least one embodiment of the invention.

FIG. 10 provides an illustration of an example silicon interposer interconnecting at least two integrated circuit chips, in accordance with at least one embodiment of the invention in the described systems environment. The interposer 101 include microbumps 1006 for connection to silicon chip 1 1002 and silicon chip 2 1004. The interposer 1010 may include through-silicon vias (TSV) for connection to flip chip bumps 1012 to a package substrate 1014.

It is noted that desirable combinations of bandwidth, pin count, and communications distance exist for both matched-impedance "transmission line" solutions and high impedance unterminated bus solutions. As subsequently described, at least one embodiment uses reduced-swing Current Mode Logic pin drivers and interconnection wiring terminated at both transmitter and receiver. Also subsequently described, at least one embodiment uses CMOS-like pin drivers and high impedance unterminated interconnection wiring.

Without loss of generality, the physical interface between devices is herein described as being point-to-point wire connections between integrated circuit devices, optionally including multidrop bussed interconnection of multiple devices. One embodiment has a silicon interposer to provide inter-chip connectivity. Another embodiment has a high density controlled impedance printed circuit board to provide inter-chip connectivity.

Further embodiments incorporate direct chip-to-chip connection with through-vias or flip-chip bonding. Other embodiments may use different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also in accordance with the invention.

Assumptions

Figure 1:
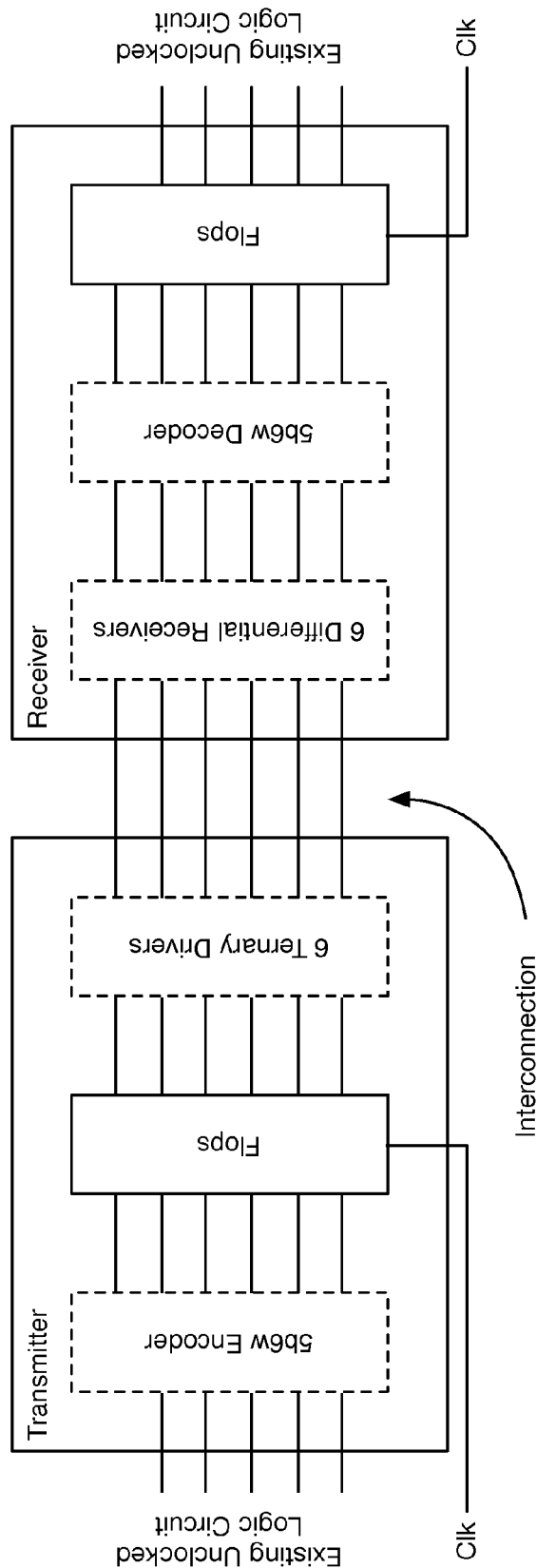
FIG. 1 is a block diagram of an example system comprised of a transmitting device, interconnection, and receiving device, in accordance with at least one embodiment of the invention.

For purposes of description and without limitation, example embodiments of at least some aspects of the invention further assume the following characteristics unless otherwise stated:
- Technology: TSMC 40 GP or equivalent medium range process
- Vdd=0.9V
- Minimal interface:
  - Forwarded clock(s) architecture
  - Line rate of 8 Gsymbols/second
  - Clock recovery/PLL using conventional means
  - 4:1 mux architecture
  - Boot time (or link idle time) clock alignment only
- Channel assumptions:
  - Short (~1 mm) low loss, low skew trace
  - Compatible with 40 μm pitch micro-bumps and ~100 wire per mm edge
  - Parasitics (100 fF for ESD, 100 pH inductance, 10 fF for the micro-bumps)
  - 50 fF load on Rx input
  - Connection impedance in the range of 50 to 80 Ohm FIG. 1 shows a general block diagram of an interconnection in accordance with at least one embodiment of the invention, having a transmitter, inter-device interconnection, and a receiver.

Terminated Transmission Line Embodiment

Figure 2:
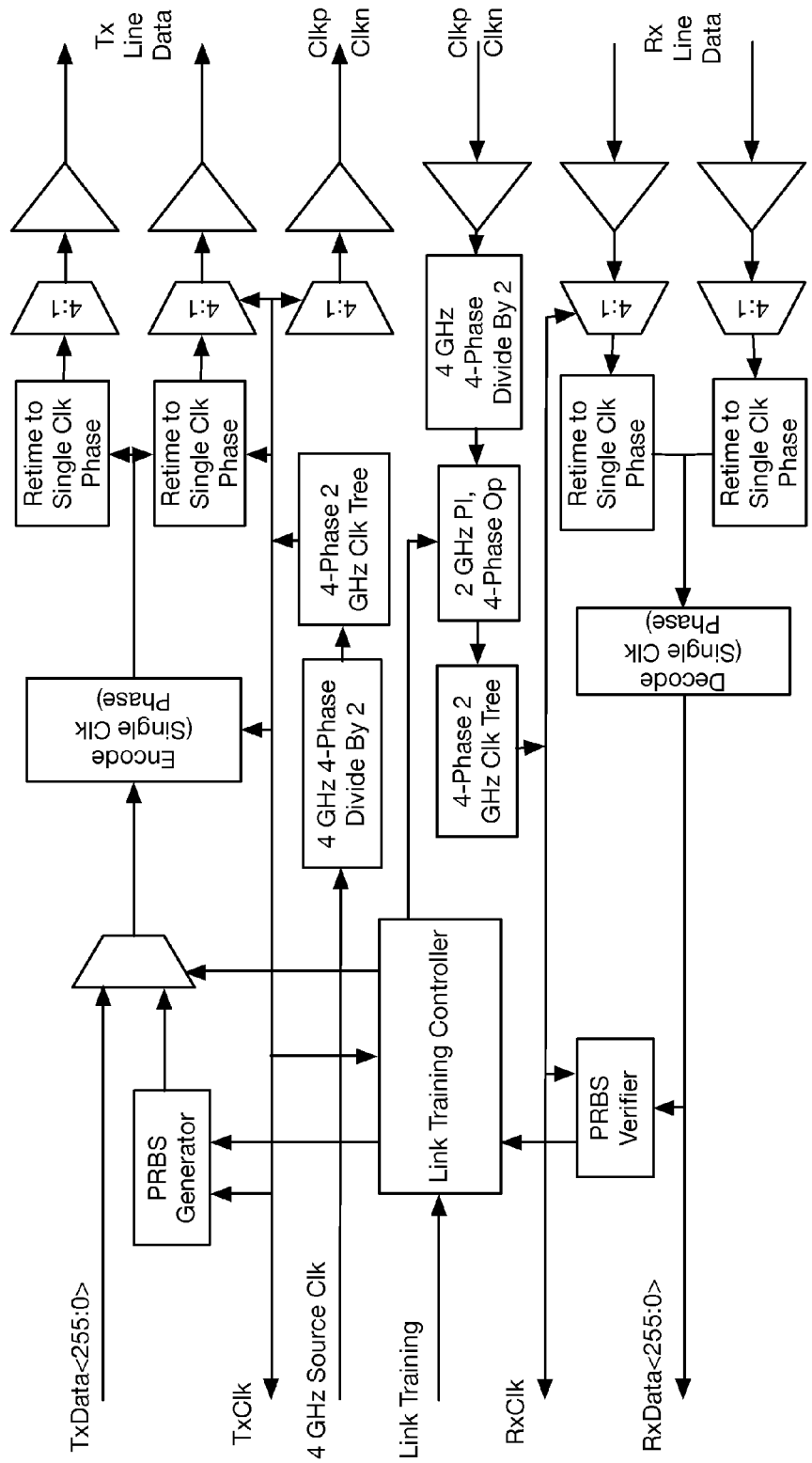
FIG. 2 is a block diagram for a bidirectional chip interface in accordance with at least one embodiment of the invention.

FIG. 2 shows the top-level architecture of a bidirectional chip interface in accordance with at least one embodiment of the invention. As an example, it presents a 4 Ghz 4:1 mux architecture that supports a line rate of 8 Gsymbols per second. This embodiment uses source- and destination-terminated Current Mode Logic drivers with reduced signal swing and a vector signaling code based on code words of six ternary symbols. Each described instance of the encoder, transmission drivers, receive comparators, and decoder will be duplicated for each six wire subset of the complete interface.

Coding Techniques

For purposes of the design of a communications system as described above, it is desirable to employ a vector signaling code that operates on a small group of wires, has a very low power detector with a small footprint, and has a high pin-efficiency. Multiple options exist for such a design, though not all of them are of the same quality.

Figure 3:
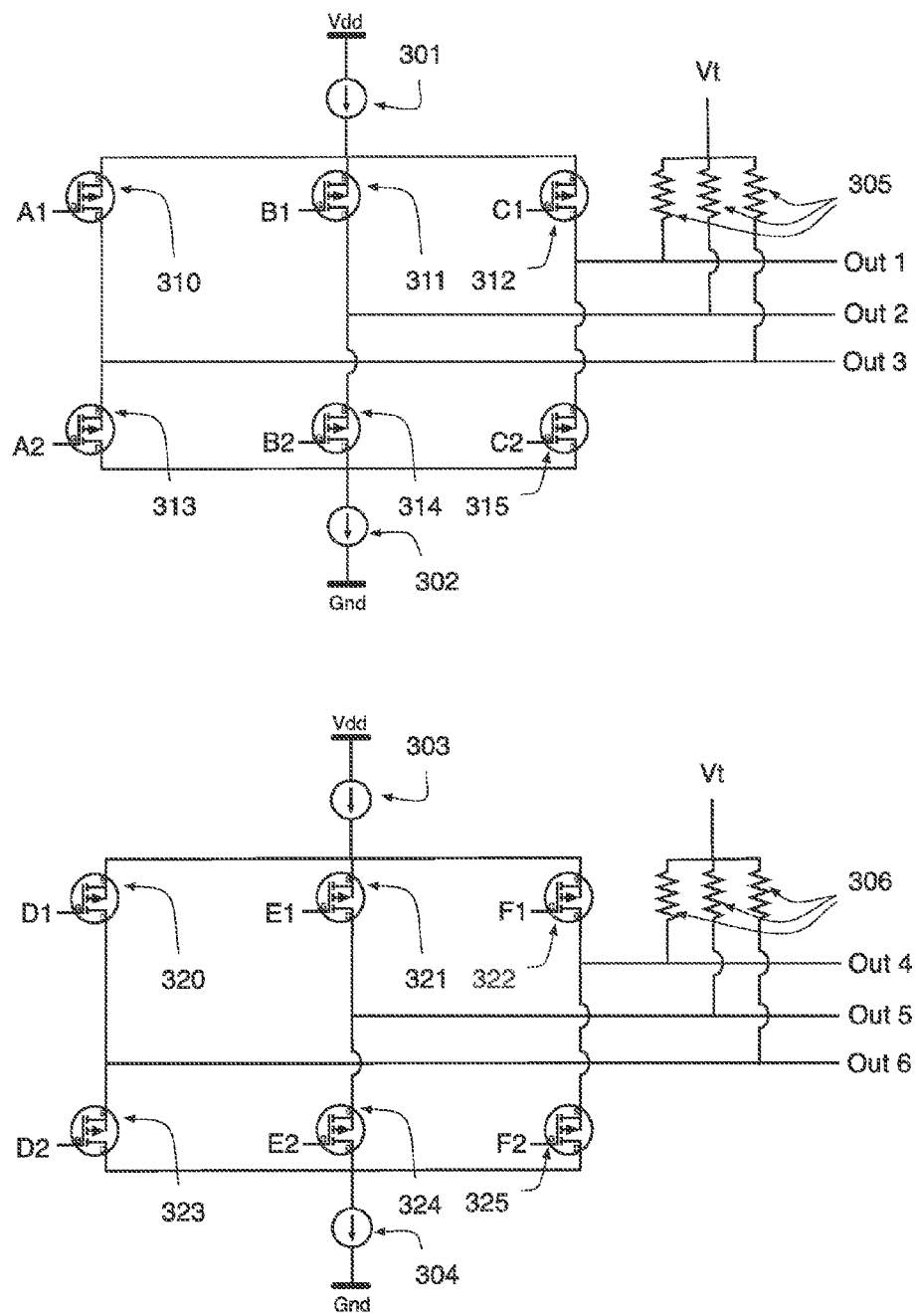
FIG. 3 is a schematic drawing of a ternary driver circuit in accordance with at least one embodiment of the invention.

Since the links described above are short and don't need heavy equalization and power-consuming elements like clock-and-data recovery, most of the power of the link is consumed by the line drivers and the line receivers or detectors, and to a lesser extent by the encoder and decoder. The power consumed by the driver can be reduced by going to a lower swing and by using a current-mode-logic topology, as shown in FIG. 3. Where the channel conditions are very favorable, and not a whole lot of eye closure is to be expected, it can be advantageous in these applications to use non-binary coding, since this type of coding further reduces the driver power consumption by virtue of the fact that the symbols transmitted on the wires have different magnitudes and hence require different amounts of power. Moreover, using non-binary coding also increases the number of bits to be sent across the wires, thereby increasing the pin-efficiency. Among the many non-binary alphabets the ternary alphabet, consisting of the elements labelled −1, 0, and +1, offers additional advantages: it is relatively simple to drive three values on the wires, and transmission methods may be used that do not require any power consumption when driving one of the states. For the purposes of this disclosure, we therefore concentrate on the case of ternary codes. It should be noted, however, that this restriction is for illustrative purposes only.

The detector power is dominated by the elements that perform comparisons among the wires. One of the simplest topologies is the one in which comparisons are made between pairs of wire values only. Full ternary permutation-modulation codes, i.e., permutation modulation codes comprising all the distinct permutations of a ternary vector, typically require a number of pairwise comparisons that is equal to $N*(N-1)/2$, wherein N is the number of wires used. So, for example, three comparators are needed for three wires, six comparators are needed for four wires, ten comparators are needed for five wires, etc. Very pin-efficient ternary vector signaling codes, i.e., ternary vector signaling codes with pin-efficiency 1 or larger, can only be obtained with six or more wires, leading to at least 15 comparators, or 5/3 comparators on average per received bit. This number may be too large in the specific applications described above. Other techniques might be needed that may slightly reduce the pin-efficiency, but drastically reduce the number of comparators per output bit.

Such coding schemes can be obtained using tools from discrete mathematics in general, and discrete optimization in particular. Suppose that C is a vector signaling permutation modulation code (ternary or not) that has M code words, each of length N. As described above, at most $N*(N-1)/2$ pairwise comparators would be sufficient to detect any code word. To reduce the number of comparisons, a certain number, say L, of comparators is chosen, and a graph, called the distinguishability graph, is set up in which the nodes are the code words. Two such nodes are connected in this graph if the chosen comparators cannot distinguish them. This means that in both code words and for all the chosen comparators either the ordering of the positions is the same under the given comparator, or in at least one of the code words the two values are the same. For example, if the comparators compare positions 1, 2, positions 1,3, positions 1,4 and positions 2,4 in a vector signaling code of length 3, then the two code words (0,0,−1,1) and (−1,0,1,0) would not be distinguishable.

Once the distinguishability graph is set up, the task is to find a largest independent set in this graph, i.e., a largest set of nodes (=code words) no two of which are connected (=indistinguishable). Various techniques can be used to find such an independent set. As is appreciated by those of skill in discrete mathematics upon reading this disclosure, the problem can be formulated as an integer linear program that can be solved (in reasonable time, if the number of code words is not too large) using standard techniques. For larger problem instances, heuristic methods can be combined with integer linear programming to achieve the goal.

For the purposes of satisfying the previously described system requirements, a good compromise between the number of comparators used and the number of bits transmitted may be that the number of comparators is one more than the number of bits transmitted. Adding this constraint, a particular implementation of the graph theoretic approach may reveal the following codes.

When the number of wires is 3, the code consisting of the code words (1,−1,0), (0,1,−1), (0,−,1), and (−1,0,1) admits two comparators: the first one compares positions 1,2, and the second one compares positions 1,3. This code is very efficient in terms of the number of comparators per bit (which is 1), and has a pin-efficiency of 2/3.

When the number of wires is four, any code that allows for transmission of three or more bits and uses no more than three comparators will introduce ambiguities and should be avoided. It is possible to avoid ambiguities using a code that allows to transmission of three bits using only four comparators. One possible such code is given by the eight vectors:

$$(1,0,0,1), (1,-1,0,0), (0,1,-1,0), (0,0,1,-1), (0,0,-1,1),$$
$$(0,-1,1,0), (-1,1,0,0), (-1,0,0,1)$$

The four comparators compare positions 1, 2, positions 1, 3, positions 1, 4, and positions 2, 3. There are, on average, 4/3 comparators per output bit, and the pin-efficiency of this code is 75%.

When the number of wires is 5, and the number of comparators is 5 as well, the best code found by the optimization procedure has 14 code words, which is two code words short of a code that can encoder 4 bits. The pin-efficiency of this code is not very good for many applications.

When the number of wires is 6, and the number of comparators is 5, the procedure reveals a code with 24 elements, which is 8 elements short of a code that can encode 5 bits.

When the number of comparisons is increased to 6, the procedure outputs a very useful coding scheme. This code, called the 5b6w code, is described in the following.

5b6w-RS code

This section defines the code that is employed together with our multi-level, reduced-swing CML interface to deliver superior link properties at low power, which is herein described as the 5b6w-RS code. This code operates on five binary inputs to produce signal values carried by six wires. To achieve the desired throughput, the overall interface incorporates multiple such code groups, as one example thirteen such groups totaling 78 signal wires collectively encoding as many as 65 binary bits of data.

The 5b6w vector signaling code is designed to send on every group of six wires 2 "+" signals, 2 "−" signals, and 2 "0" signals. This code is thus "balanced", having the same number of "+" values as "−" values per group. A knowledgeable practitioner would note that without additional constraint, a code based on sending 2 "+" signals and 2 "−" signals on every group of 6 wires has 90 distinct combinations, sufficient to encode 6 bits instead of 5. However, in the interest of keeping the encoder/decoder low complexity and thus requiring low implementation area, and in the interest of permitting a very low-power receiver architecture, we have opted to use a particular subset of those combinations, consisting of the following 32 code words:

(+1,0,−1,+1,0) (+1,−1,0,+1,−1,0), (−1,+1,0,−1,0,+1),
(−1,0,+1,0,+1,−1) (+1,−1,0,0,−1,+), (+1,0,−1,+1,
0,−1), (−1,0,+1,−1,+1,0), (−1,+1,0,+1,−1,0) (0,+
1,−1,−1,0,+1), (0,+1,−1,+1,−1,0), (−1,0,+1,−1,
0,+1), (−1,+1,0,+1,0,−1) (−1,0,+1,0,−1,+1), (+1,
0,−1,0,−1,+1), (+1,−1,0,0,+1,−1), (0,−1,+1,−1,+
1,0) (−1,0,+1,+1,−1,0), (+1,−1,0,−1,+1,0), (0,+
1,−1,+1,0,−1), (−1,+1,0,0,−1,+1) (−1,0,+1,+1,0,−
1), (+1,−1,0,−1,0,+1), (+1,0,−1,0,+1,−1), (−1,+1,
0,0,+1,−1) (0,−1,+1,−1,0,+), (0,−1,+1,+1,−1,0),
(+1,0,−1,−1,0,+1), (+1,−1,0,+1,0,−1) (−1,+1,0,−
1,+1,0), (0,−1,+1,+1,0,−1), (0,+1,−1,−1,+1,0),
(+1,0,−1,+1,−1,0)

The comparators needed to distinguish these code words compare positions 1, 2, positions 2, 3, positions 1, 3, positions 4, 5, positions 5, 6, and positions 4, 6. This coding also ensures immunity to SSO noise.

The −RS designation indicates that wire signaling of the encoded groups uses Reduced Swing signal values, where a "+" signal may be represented by a value +200 mV over reference level, a "0" signal may be represented by a value +100 mV over reference level, and a "−" signal may be represented by a value 0 mV over reference level. These signal levels are given as examples, without limitation, and represent incremental signal values from a nominal reference level.

Transmit Driver

In accordance with at least one embodiment of the invention, FIG. 3 shows a schematic of a transmit driver for one group of six wires, Out 1 through Out 6. An offset or quiescent signal level is provided by voltage source Vt and transmit termination resistors 305, which induce a known current into each receive wire termination, creating the desired receive signal level representing a "0" signal. Enabling one of transistors 310, 311, 312 with one of inputs A1, B1 or C1 will add current 301 to the selected output Out 1, Out 2, or Out 3 respectively, creating a "+" signal level on that wire. Similarly, enabling one of transistors 313, 314, 315 with one of inputs A2, B2, or C2 will remove current 302 from the selected output Out 1, Out 2, or Out 3 respectively, creating a "−" signal level on that wire. The baseline reference and incremental signal levels are controlled by the values of Vt and current sources 301 and 302, along with the known values of the termination resistances.

Drivers for wires Out 4, Out 5, and Out 6 operate in the same manner, controlled by inputs D1, E1 and F1 for the "+" symbol level, and inputs D2, E2, and F2 for the "−" symbol level.

Within each subgroup of three wires, Out 1/Out 2/Out 3 and Out 4/Out 5/Out 6, there will be exactly one "+" signal, one "0" signal, and one "−" signal. Thus, current consumption in the drivers for each subgroup of wires is constant, introducing no Simultaneous Switching Output noise into the system.

Line Receiver

Figure 4A:
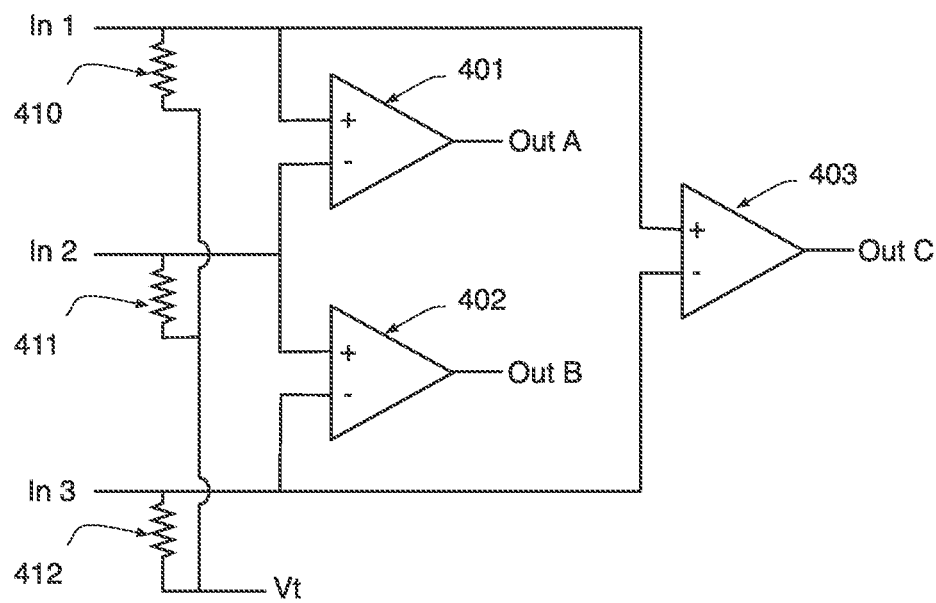
FIG. 4A and FIG. 4B are schematic drawings of line receiver circuits in accordance with at least one embodiment of the invention.

In accordance with at least one embodiment of the invention, FIG. 4A shows a schematic of a line receiver for a group of six wires using the 5b6w-RS code. Six differential comparators 401 through 406 are used per wire group, performing the six comparisons (In 1-In 2), (In 2-In 3), (In 1-In 3), (In 4-In 5), (In 5-In 6), and (In 4-In 6) to produce the six digital outputs Out A through Out F respectively. The receiver is therefore reference-less, and provides good common-mode noise rejection.

Each input In 1 through In 6 is shown as being terminated by resistors 410 through 415 respectively to termination voltage Vt. In one embodiment, Vt is at system ground.

Figure 4B:
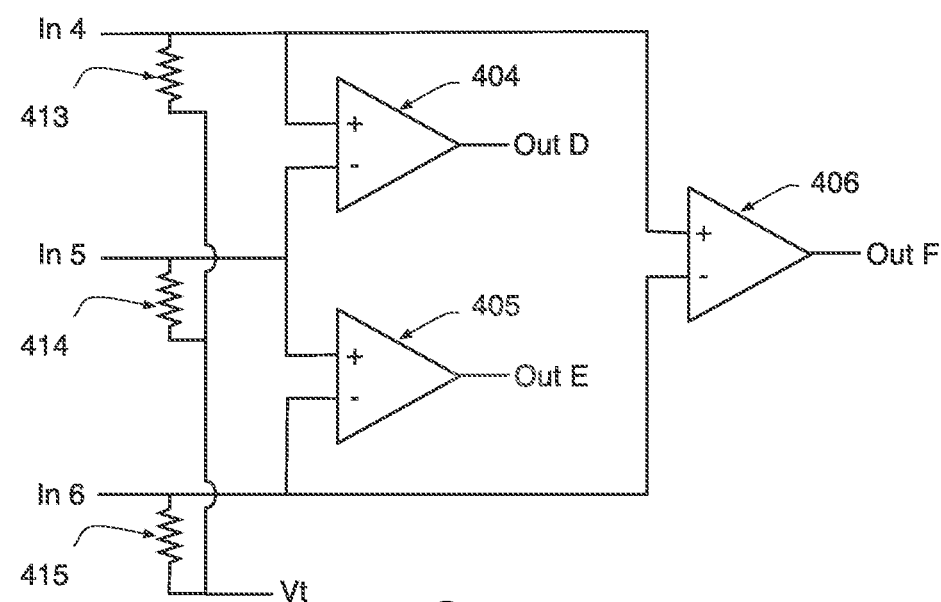

FIG. 4B differs from FIG. 4A only in connection of the termination resistors. In the embodiment shown in FIG. 4B, resistors 410, 411, and 412 connect to a common node; the combined receive current of the single "+" signal and the single "−" signal present in the wire subgroup {In 1, In 2, In 3} induces a known voltage at the common node which serves as a virtual source of the "0" signal level. This common termination connection is repeated for resistors 413, 414, and 415.

Figure 5A:
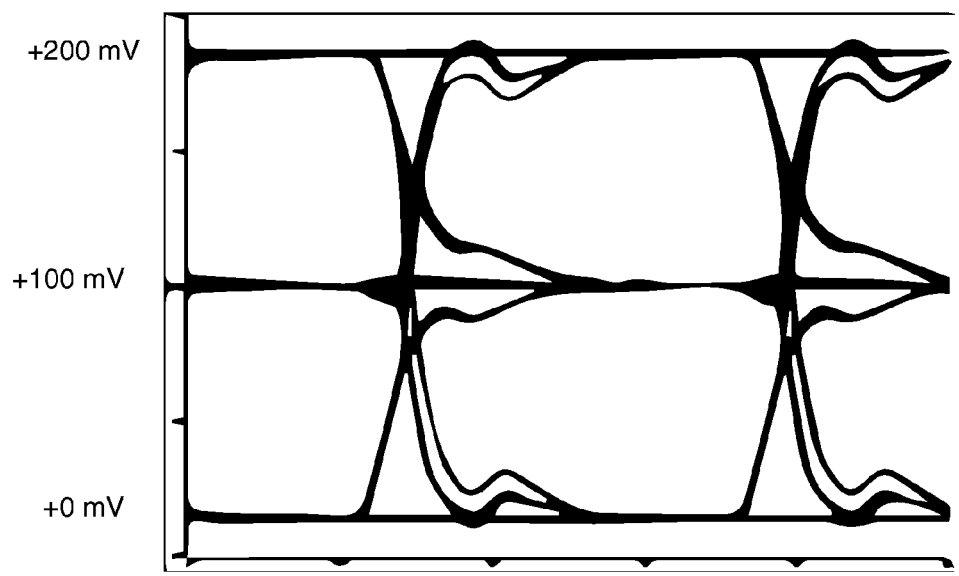
FIG. 5A and FIG. 5B show eye graphs of the described 5b6w-RS encoded system, in accordance with at least one embodiment of the invention.
Figure 5B:
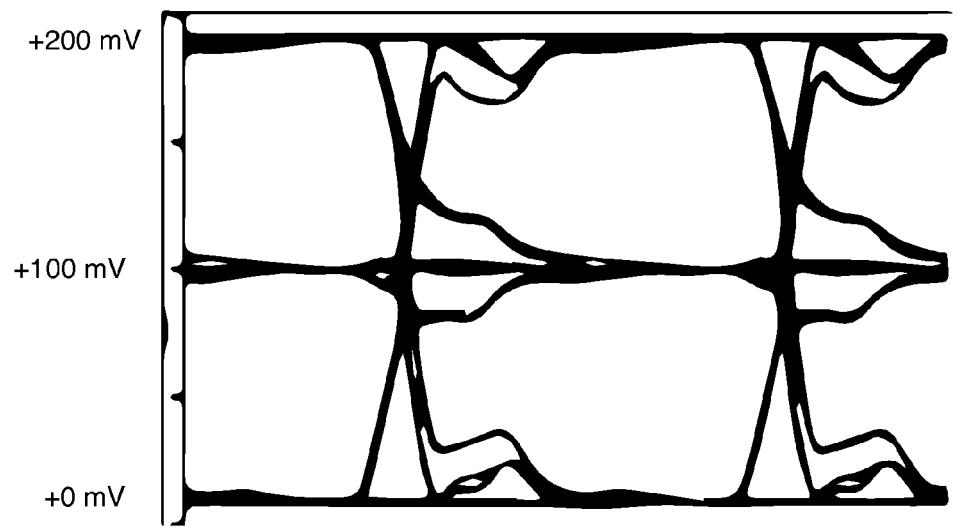

Example eye diagrams for this signaling method are shown in FIG. 5A and FIG. 5B, with FIG. 5A illustrating simulated receive levels with source and destination 100 ohm terminations and 1 μm interconnection lines, and FIG. 5B illustrating the same system simulation with 3 μm interconnection lines. Voltages are shown as offsets from a baseline reference level.

5b6w-RS Encoding and Decoding

Figure 6:
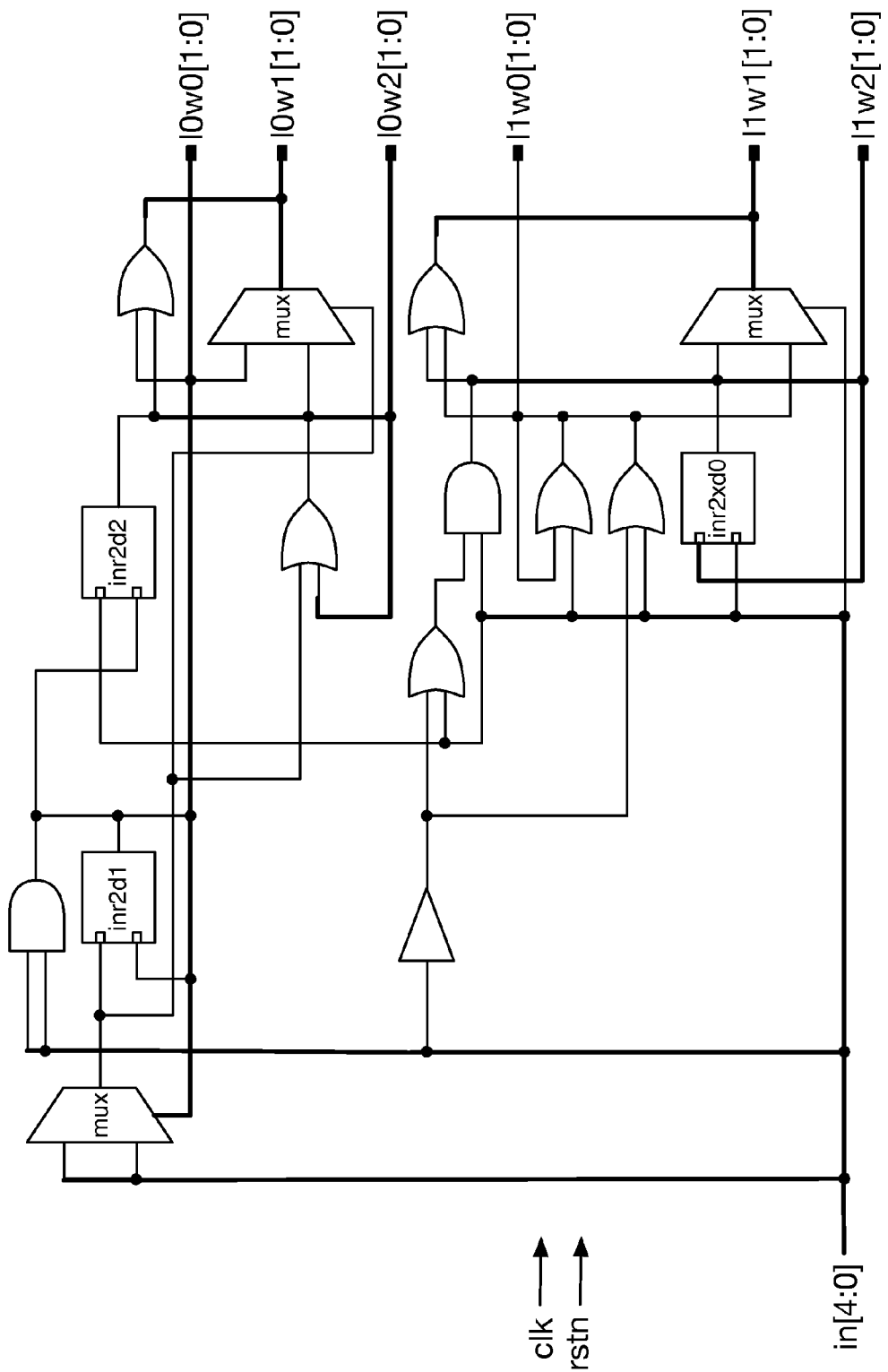
FIG. 6 is the schematic of a 5b6w encoder in accordance with at least one embodiment of the invention.

In accordance with at least one embodiment, encoding five bits of binary data into six signals of a vector signaling code word may be done using a simple one-to-one mapping between a data value and a code word, using, as examples, a lookup table or combinatorial logic. At high speeds, a combinatorial logic encoder will require fewer implementation resources, and thus result in lower power and lower operational latency. In another embodiment, one example combinatorial logic encoder is shown in the schematic of FIG. 6. The five input bits of In[4:0] produce encoded outputs I0w0[1:0], I0w1[1:0], I0w2[1:0], I1w0[1:0], I1w1[1:0], and I1w2[1:0] to control the output drivers for six wires. As the output wire signals are ternary, two binary encoder outputs are required to control each ternary output driver signal (as an example, signals A1, A2, B1, B2, C1, C2 of FIG. 3.)

Figure 7:
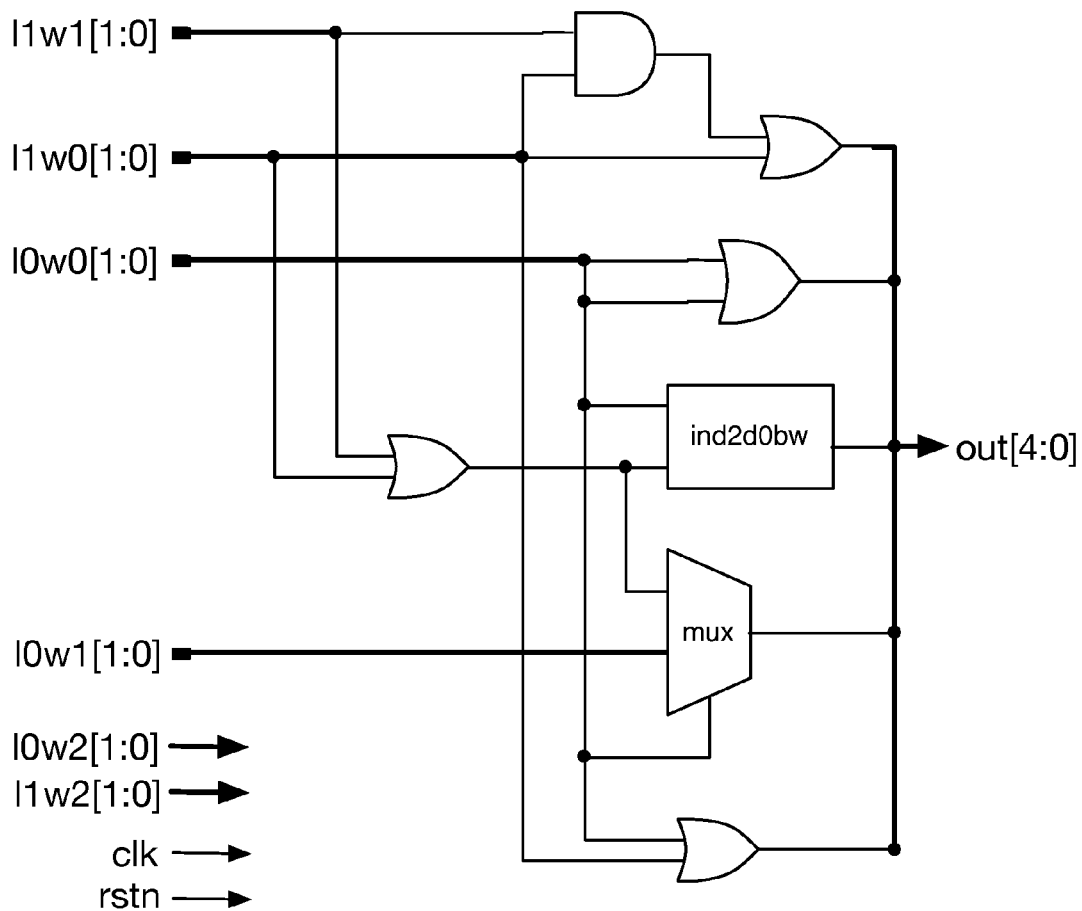
FIG. 7 is the schematic of a 5b6w decoder in accordance with at least one embodiment of the invention.

In accordance with at least one embodiment, determining which five bit binary data value is represented by the received signals (as an example Out A through Out F of FIGS. 4A and 4B) may similarly be done using a lookup table or combinatorial logic. Again, at high speeds a combinatorial logic decoder will require fewer implementation resources, and thus result in lower power and lower operational latency. In accordance with at least one embodiment, one example combinatorial logic decoder is shown in the schematic of FIG. 7.

One example embodiment of a transmitter and receiver using 5b6w-RS was determined to require 169 mW (typical) and 253 mW (worst case) in the specified example system configuration. Approximately 0.37 square millimeters of circuit area are required in the specified example process for implementation.

Other variants of the 5b6w-RS coding are known, with examples given in references Cronie I, Cronie II, Cronie III, and Fox I.

Unterminated Interconnection Embodiment

This section describes another solution satisfying the specified systems requirements, using voltage-mode CMOS-like drivers and unterminated interconnection wiring.

In accordance with at least one embodiment, a transition-limiting code herein called Transition-Limiting Ternary 4-Wire 1-Transition Reduced Swing code or "TLT(4,1)-RS code," is described. In one embodiment, it employs a small Finite Impulse Response (FIR) filter to minimize the transitions sent over four wires using a three level (ternary) interface on each wire.

Choice of Driver

In a low capacitance, moderate frequency and/or transition-limited interface applications, the power consumption of an unterminated CMOS driver can be lower than that of a CML driver such as was used in the previous example. The solution described in this section uses CMOS-like drivers.

An unterminated CMOS-like driver has the property that its power consumption occurs mostly on transitions. As a result, CMOS-like drivers always cause some SSO, no matter what coding technique is used. Since it is not possible to eliminate SSO noise using a CMOS-like driver, our goal will therefore be to substantially reduce the SSO noise as well as the power consumption of the I/O interface.

For the SSO and power calculations incorporated in this document, the following assumptions have been made:
1. Because CMOS drivers are used, most of the supply power is consumed only at transition from a lower voltage value to a higher voltage value; the power consumed is proportional to the amount of this transition.
2. A much smaller fraction of power is consumed in the transition from a higher voltage to a lower voltage. This is due to effects such as inverter chains in drivers.
3. The contribution of a single wire to the total SSO when transitioning from a value x to a value y is the absolute value of x-y.
4. The total SSO is the sum of the SSO contributions of all the wires.
5. Both SSO and power consumption are given in the following as single numbers; they should be seen in relation with the numbers obtained for single-ended CMOS drivers driving an equivalent load at an equivalent transition rate.

Ternary Levels

As discussed above, this disclosure advocates the use of 3 level signaling on every transmission wire. We call the coding scheme "ternary coding." In this example, the levels correspond to voltage levels on the wires, which in turns depends on the Vdd of the system and the swing of the signals. To have a voltage-independent description, and to have a fair comparison to single-ended signaling, the examples herein assume that For full-swing Single-Ended (SE) binary signaling, the voltage level multipliers are 0 and 1 (i.e., the voltage levels correspond to 0*Vdd and 1*Vdd)

For Reduced-Swing (RS) ternary coding, the voltage level multipliers may be 0, ¼, and ½.

The assumed values are provided for purposes of description and do not imply a limitation.

Line States

For simplicity in the description of coding algorithms later in the document, the two binary states are designated 0 & 1 and the three ternary states as 0, 1 & 2. These states are independent of the voltage level multipliers described above that are used to transmit them.

Noise Models

For the example embodiments addressing the described systems constraints, Simultaneous Switched Output (SSO), noise may be considered to be the dominant noise source as compared to thermal and other sources of noise.

Power and SSO Reduction Techniques

In accordance with at least one embodiment of the invention, two interface improvement techniques are described that may be adopted singly, or both together for maximum effect.

The first improvement technique is to add a transition-limiting coding scheme. This will be described in the following section.

The second improvement technique is a reduction in the swing of the interface. An important method to save both power and SSO noise on a broad, high-bandwidth interface is to reduce the swing of that interface. The low-swing version of the ternary interface described below yields further reductions of the peak SSO and the average power consumption.

Transition-Limiting Coding

Because it is the transitions that are important in an unterminated CMOS driver, it makes sense to encode the information in the transitions. If we use binary states on the wires then it is not possible to reduce SSO and at the same time maintain full pin-efficiency, i.e., the property of transmitting one bit per clock cycle on every wire. Therefore, methods of reducing the SSO for applications described herein can use ternary coding. As disclosed herein, such codes can reduce the peak SSO to approximately 12.5% of that of single-ended signaling.

One SSO-reducing code is herein called TLT(4,1)-RS. It is a small and useful code that uses just four wires. Thus, an embodiment satisfying the example system requirements incorporates multiple iterations of this four-wire subsystem to satisfy overall throughput requirements.

A transition coding scheme can be described that is based on mod-3 addition. This operation adds one of the three integers 0/1/2 with another such integer, and outputs the remainder of this addition when divided by the number 3. Alternatively, this addition can be described by the following table:

|   | 0 | 1 | 2 |
|---|---|---|---|
| 0 | 0 | 1 | 2 |
| 1 | 1 | 2 | 0 |
| 2 | 2 | 0 | 1 |

TLT(4,1)-RS Code

TLT(4,1) coding operates on an interface size of four wires with one allowed transition per cycle, i.e., a group of four wires is used on which the state transitions between the clock cycles are minimized by permitting only one wire value to change on each clock cycle. It is a ternary code, thus each wire can take on one of three values, herein called 0, 1, and 2. As one wire change is permitted between consecutive encoded TLT(4,1) outputs, the space of possible encodings is 9 (no transition, or one of four possible wires changing to either of two new values.) Thus, changes of a three bit input data word represented, as an example, as a three bit difference between the current input data word and the previous input data word, may be encoded directly in one TLT(4,1) code.

The encoder might incorporate the previously-described mod-3 addition method and a simple FIR filter. This FIR filter keeps one clock of history and encodes the changes of the data to be transmitted with respect to that history. An efficient encoder uses only a few operations on the state of each wire.

In operation, an encoder may proceed as follows: given three bits a,b,c, and a history vector (x[0],x[1],x[2],x[3]), wherein the entries of this vector are ternary values and may be from the set {0, 1, 2}, the encoder changes the value of x[a+2*b] to x[a+2*b]+(c+1) modulo 3, if (a,b,c) is not (0,0,0), and it doesn't change the value at all if (a,b,c)=(0,0,0). When using reduced swings, then the worst case SSO is obtained when a wire's value changes from the state 0 to state 2 (or vice-versa), thereby changing its voltage from 0*Vdd to Vdd/ 2. This is equivalent to half the worst case SSO of a full-swing unterminated CMOS driver on one wire. Since this affects only one wire in four, the worst case SSO of this reduced swing coding technique is one eighth that of the full swing unterminated CMOS driver. Reducing the swing further will of course reduce the maximum per-wire SSO.

The average line power consumption of the reduced swing TLT(4,1) code (or TLT(4,1)-RS for short) is also much better than that of a full-swing CMOS driver. Whereas the average per-wire power consumption of a full-swing CMOS driver is $C*Vdd^2*f/4$, wherein C is the capacitance of the wires, and f is the frequency of the clock, the average power consumption of the TLT(4,1)-RS code is $C*Vdd^2*f/6$ if there is a transition on that wire, and 0 otherwise. Since in a group of 4 wires there is exactly one that makes a transition if the incoming bit-sequence is not (0,0,0), and there is no wire making a transition otherwise, we see that the average per-wire power consumption of the TLT(4,1)-RS code is $7*C*Vdd^2*f/(6*8*4)=7*C*Vdd^2*f/192$. This is about 14.6% the per-wire power consumption of the unterminated full swing CMOS driver.

In the reduced swing version of TLT(4,1) (TLT(4,1)-RS), the peak per-wire SSO is ⅛th, which is 12.5% that of the peak per-wire SSO of single-ended signaling.

Other embodiments that are equivalent to the described TLT(4,1)-RS encoder are known, such as those incorporating alternative mappings of data transitions to encoded values and/or other means of determining data transitions.

Reset of the Transition Code

Two additional related issues exist with the use of transition codes. The first issue is ensuring that the history values used at each end are coordinated when the bus is used sporadically. The second issue is ensuring that transitions on the line are minimized when the bus is not in use.

Ensuring that the history values at each end of the bus are the same is not a problem for buses that are running continuously. Multiple solutions can be provided for transition codes when the data bus is not in use, by resetting the history value of the FIR filter to a known value.

The second issue with the use of transition codes is to carefully control the Idle/NOP values on the bus. Since the point using a transition code is to minimize the transition on the bus, it is important to make sure that there are no transitions on the bus when the bus is not in use. Many buses sit Idle/NOP most of the time, so the power dissipated in these situations is central to the overall power consumption of the system.

TLT(4,1)-RS Block Diagram

Figure 8A:
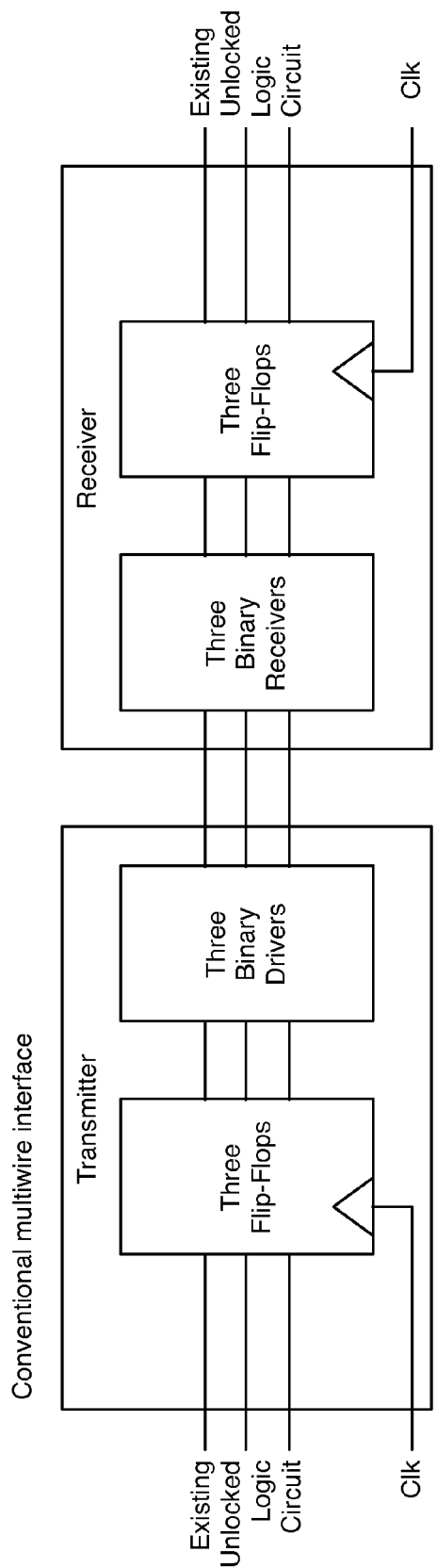
FIG. 8A and FIG. 8B are respective block diagrams of a conventional multiwire interface and a system using TLT(4, 1)-RS coding, in accordance with at least one embodiment of the invention.
Figure 8B:
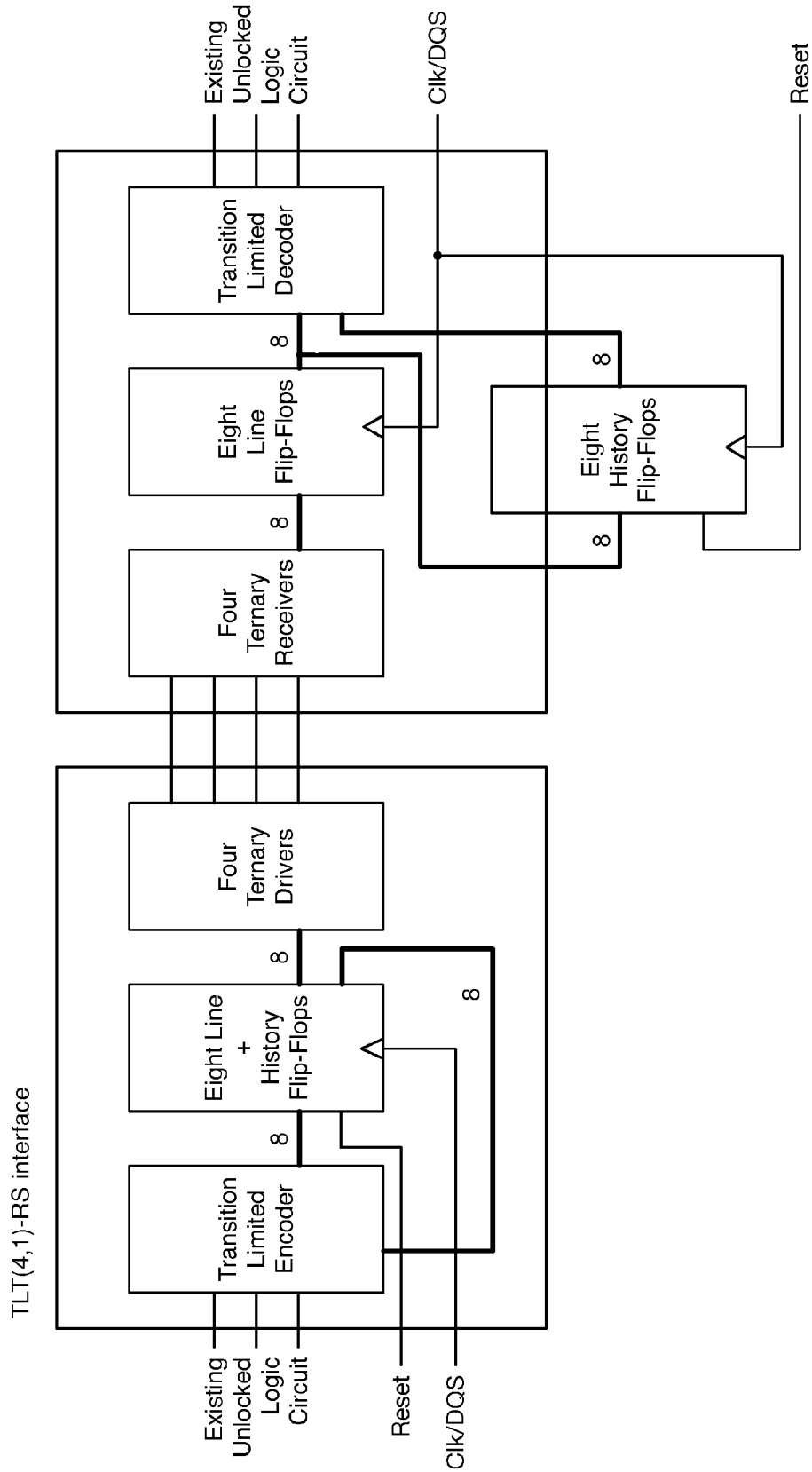

A block diagram of a TLT(4,1)-RS interface is shown in FIG. 8B. For comparison, a conventional multiwire interface is shown as FIG. 8A. As shown, FIG. 8B includes a first Transition Limited Encoder receiving a data word from a first Existing Unclocked Logic Circuit. A Line and History Flip-Flops module accepts the output of the first Transition Limited Encoder, as well as a Reset signal and a Clk/DQS signal. A set of Four Ternary Drivers accepts the output of the History Flip-Flops module and sends four signals as a code word to Four Ternary Receivers. Eight Line Flip-Flops receive the outputs of the Four Ternary Receivers. Eight History Flip-Flops receive the output of the Line Flip-Flops, along with the Reset and Clk/DQS signal. A Transition Limited Decoder is connected to the outputs of the Eight Line Flip-Flops and the Eight History Flip-Flops, and provides an output to an Existing Unclocked Logic Circuit. In at least one embodiment, the Transition Limited Encoder is configured to produce a code word encoding a representation of the differences between the current input data word and a previous input data word, and the Transition Limited Decoder is configured to interpret the received code word as representing differences to be applied to a previous received data word to obtain the received data word.

It should be noted that the extra history flip-flops used by TLT(4,1)-RS to embody the FIR filter (or equivalent transition encoding logic) are outside of the main data path, and thus do not introduce any additional data-path latency. Thus, an TLT(4-1)-RS embodiment such as shown in FIG. 8B will fit into the same general system timing plan as a conventional interface such as shown in FIG. 8A. It will need additional timing margin, but no additional clock cycles.

In at least one embodiment, the decoder is placed immediately after the ternary receivers, as a variant to the receiver shown in FIG. 8B.

Startup Algorithm

Straightforward application of the techniques disclosed in this document may lead to one clock latency penalty for the initialization of the history value. This penalty may be mitigated by initialization of the history values of both transmitter and receiver to a known state, as examples at system reset, each time the bus goes idle, or whenever a new active transmitter and/or receiver is selected in a multidrop bus system.

TLT(4,1)-RS Transmit Driver and Ternary Receiver

Figure 9A:
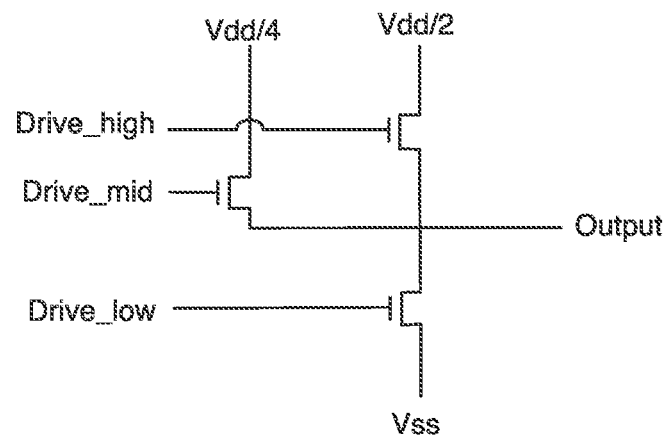
FIGS. 9A and 9B is a schematic of ternary low-swing driver and ternary line receiver circuits, in accordance with at least one embodiment of the invention.

In accordance with at least one embodiment, an example transmit driver uses a NMOS transistor to drive the low level. For the middle level as well as the high level in reduced-swing TLT(4,1)-RS, NMOS source-follower transistors are used pulling to the reference voltages. One example of such a driver is shown in the schematic of FIG. 9A.

Figure 9B:
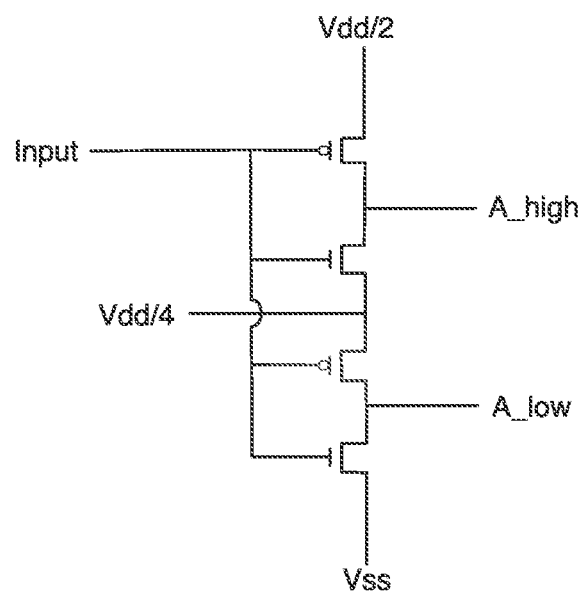

At the receiver, detection of a high, middle, or low signal level of each wire is required. In accordance with at least one embodiment, two comparators per wire may be used to compare the signal level of the wire against known reference voltages. A simpler and more compact embodiment is shown in the schematic of FIG. 9B, using four transistors and one reference voltage to obtain both required signal level indicators. This circuit may be applied where the semiconductor process provides sufficiently low transistor threshold voltages.

Typical values for the reduced-swing levels are at 0, Vdd/4 and Vdd/2. These example values may be adjusted to optimize system behavior based on the particular system voltages and semiconductor processes in use.

Producing the Vdd/4 and Vdd/2 mid-level and high-level voltages on-chip may be challenging. The produced voltages must be accurate, have little ripple, have low wasted power, and must exhibit these properties over their whole load range. Linear regulators, while accurate, waste power. Switching regulators are hard to implement on-chip without good passive components. One embodiment provides these voltages externally. Another embodiment obtains the Vdd/2 voltage externally and then creates the Vdd/4 voltage on-chip with a linear regulator, with the effect of balancing the complexity of delivering the voltages with the added power consumption incurred through the use of a linear regulator.

One example embodiment of a transmitter and receiver using TLT(4,1)-RS was determined to require 167 mW (typical case) and 305 mW (fast corner case) in the specified example system configuration.

The examples presented herein illustrate the use of vector signaling codes for point-to-point or multidrop bussed chip-to-chip interconnection. However, this should not been seen in any way as limiting the scope of the described invention. The methods disclosed in this application are equally applicable to other interconnection topologies and other communication media including optical, capacitive, inductive, and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. An apparatus comprising:
a multi-wire bus configured to receive a set of N signals corresponding to N elements of a code word, wherein the elements of the code word comprise a set of at least three values, wherein the code word represents a set of n input bits, wherein n is an integer greater than 1 and N<2n;
a reference-less line receiver comprising a set of n+1 comparators, the set of n+1 comparators configured to operate on the received set of signals and responsively form a set of n+1 comparator outputs based on the received signals, wherein at least two comparators receive a common signal of the received set of N signals; and,
a decoder configured to receive the set of n+1 comparator outputs and responsively generate a set of n output bits representing the set of n input bits.

2. The apparatus of claim 1, wherein 5 comparator outputs are decoded to generate 5 output bits.

3. The apparatus of claim 1, wherein the code word is balanced.

4. The apparatus of claim 3, wherein the set of at least three values comprises the set of values consisting of {−1, 0, +1}.

5. The apparatus of claim 1, wherein each value of each element of the code word corresponds to a voltage that is less than a voltage Vdd supplied by a power source.

6. The apparatus of claim 5, wherein at least one element corresponds to a voltage of ½*Vdd.

7. The apparatus of claim 5, wherein at least one element corresponds to a voltage of ¼*Vdd.

8. The apparatus of claim 1, wherein 4 comparator outputs are decoded to generate 3 output bits.

9. The apparatus of claim 1, wherein each received signal is terminated to a termination voltage Vt using a termination resistor.

10. The apparatus of claim 9, wherein Vt corresponds to system ground.

11. The apparatus of claim 1, wherein each received signal is terminated to a common node using a termination resistor.

12. The apparatus of claim 1, wherein the decoder comprises combinatorial logic to decode the set of n comparator outputs.

13. The apparatus of claim 1, further comprising:
a plurality of wires configured to receive the set of n input bits representing the set of n output bits;
an encoder configured to generate the elements of the code word; and,
a transmit driver configured to transmit each respective element of the code word on a respective output wire of a set of output wires.

14. The apparatus of claim 13, wherein for each respective element of the code word to be transmitted, the transmit driver comprises:
a voltage source configured to provide a signal level corresponding to a middle signal level on the respective output wire of the set of output wires;
a first transistor configured to receive a first input signal of a respective pair of input signals, the respective pair of input signals corresponding to a value of the respective element of the code word, wherein the first transistor is configured to provide a positive signal level to the output wire if the first input signal is high and provides no contribution otherwise; and,
a second transistor configured to receive a second input signal of the respective pair of input signals and provide a negative signal level to the output wire if the second input signal is high and no contribution if otherwise, wherein only one input signal of the respective pair of input signals can be high at one time.

15. The method of claim 14, wherein the middle signal level corresponds to a quiescent signal level.

16. A method comprising:
receiving a set of N signals corresponding to N elements of a code word, the elements of the code word comprising a set of at least three values, the code word representing a set of n input bits, wherein n is an integer greater than 1 and N<2n;
operating on the N received signals using a set of n+1 comparators and responsively forming a set of n+1 comparator outputs based on the received signals, wherein at least two comparators receive a common signal of the received set of N signals; and,
decoding the set of n+1 comparator outputs into a set of n output bits representing the n input bits.

17. The method of claim 16, wherein decoding the set of n+1 comparator outputs comprises using a combinatorial logic decoder.

18. A method comprising:
receiving a set of n input bits representing information, wherein n is an integer greater than 1;
generating elements of a code word based on the received set of n input bits; and, for each element of the code word:
forming a respective pair of driver signals corresponding to a value of a respective element of the code word, wherein at most one driver signal of the respective pair can be high at any time; and,
generating a signal level on a respective output wire of a set of output wires based on the respective pair of driver signals.

19. The method of claim 18, wherein each driver signal of each respective pair of driver signals controls a respective transistor of a pair of transistors to provide a positive or negative signal level to the respective output wire.

20. The method of claim 19, wherein the positive or negative signal level is contributed by sourcing or sinking current, respectively.

* * * * *